(12) United States Patent
Kunitomo

(10) Patent No.: US 10,367,510 B2
(45) Date of Patent: Jul. 30, 2019

(54) CRYSTAL OSCILLATOR AND METHOD FOR MANUFACTURING CRYSTAL OSCILLATOR

(71) Applicant: NIHON DEMPA KOGYO CO., LTD., Tokyo (JP)

(72) Inventor: Hiroyasu Kunitomo, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 160 days.

(21) Appl. No.: 15/592,200

(22) Filed: May 11, 2017

(65) Prior Publication Data

US 2017/0331431 A1 Nov. 16, 2017

(30) Foreign Application Priority Data

May 13, 2016 (JP) .................................. 2016-096947
Jan. 27, 2017 (JP) .................................. 2017-013051

(51) Int. Cl.
*H03L 1/04* (2006.01)
*H03L 1/02* (2006.01)
*H03H 9/02* (2006.01)
*H03H 9/05* (2006.01)

(52) U.S. Cl.
CPC ........... *H03L 1/04* (2013.01); *H03H 9/02102* (2013.01); *H03H 9/0519* (2013.01); *H03H 9/0547* (2013.01); *H03L 1/028* (2013.01)

(58) Field of Classification Search
CPC .......... H03B 5/32; H03H 9/0547; H03H 9/10; H03H 9/02102; H03L 1/02; H03L 1/04; H03L 1/028; H01L 41/053
See application file for complete search history.

(56) References Cited

U.S. PATENT DOCUMENTS

| 8,035,454 B2 * | 10/2011 | Navet ................... H03L 1/04 310/343 |
| 8,174,331 B2 * | 5/2012 | Kishi ................... H03L 1/025 310/315 |
| 9,918,386 B2 * | 3/2018 | Frenette ................. H05K 1/181 |
| 2013/0328452 A1 * | 12/2013 | Fujihara .............. H01L 41/0475 310/365 |

FOREIGN PATENT DOCUMENTS

JP 2010-124348 6/2010

OTHER PUBLICATIONS

Wikipedia, "Flip chip", revision as of Dec. 8, 2014, retrieved on Dec. 12, 2018 from https://en.wikipedia.org/w/index.php?title=Flip_chip&oldid=637168205 (Year: 2014).*

* cited by examiner

*Primary Examiner* — Ryan Johnson

(74) *Attorney, Agent, or Firm* — JCIPRNET

(57) ABSTRACT

A crystal oscillator includes a quartz crystal piece, a semiconductor chip, and a temperature sensor. The semiconductor chip includes an oscillator circuit to cause the quartz crystal piece to oscillate and a first bump. The first bump is connected to the oscillator circuit and disposed on a surface of the semiconductor chip facing the quartz crystal piece. The temperature sensor is bonded to the first bump.

7 Claims, 9 Drawing Sheets

CRYSTAL OSCILLATOR AND METHOD FOR MANUFACTURING CRYSTAL OSCILLATOR

CROSS-REFERENCE TO RELATED APPLICATIONS

This application is based on and claims priority under 35 U.S.C. § 119 to Japanese Patent Application No. 2016-096947, filed on May 13, 2016 and Japanese Patent Application No. 2017-013051, filed on Jan. 27, 2017, the entire contents of which are incorporated herein by reference.

TECHNICAL FIELD

This disclosure relates to a crystal oscillator and a method for manufacturing the crystal oscillator.

DESCRIPTION OF THE RELATED ART

Conventionally, as a crystal oscillator including a quartz crystal piece, there is known a Temperature Compensated Crystal Oscillator (TCXO) including the quartz crystal piece, a temperature sensor, and a temperature compensation circuit. There also is known an Oven Controlled Crystal Oscillator (OCXO) including the quartz crystal piece, the temperature sensor, a heater circuit, and a temperature control circuit (see Japanese Unexamined Patent Application Publication No. 2010-124348).

FIG. 9 is a cross-sectional view of a conventional crystal oscillator 800. The conventional crystal oscillator 800 includes a quartz crystal piece 820 and a semiconductor chip 830 inside a package 810. The quartz crystal piece 820 is secured to the package 810 with a conductive connecting portion 850. The semiconductor chip 830 internally includes an internal circuit 831 that includes a temperature sensor device 840 and an oscillator circuit 832. The temperature sensor device 840 is thermally connected to the quartz crystal piece 820 with a $SiO_2$, SiN, and polyimide protective coat in between.

The crystal oscillator, such as the TCXO and the OCXO, that controls the oscillator circuit based on a temperature detected with the temperature sensor is required to measure a temperature near the quartz crystal piece with accuracy as high as possible to improve accuracy of an oscillation frequency. However, with the conventional crystal oscillator 800, since a plurality of kinds of materials having a poor heat transfer property are disposed between the temperature sensor device 840 and the quartz crystal piece 820, the heat transfer model becomes complicated, and it has been difficult to improve detection accuracy of the temperature near the quartz crystal piece. As a result, an error of frequency temperature compensation is enlarged, and there has been a problem that frequency accuracy of an oscillation signal deteriorates.

A need thus exists for a crystal oscillator and a method for manufacturing the crystal oscillator which are not susceptible to the drawback mentioned above.

SUMMARY

According to a first aspect of this disclosure, there is provided a crystal oscillator that includes a quartz crystal piece, a semiconductor chip, and a temperature sensor. The semiconductor chip includes an oscillator circuit to cause the quartz crystal piece to oscillate and a first bump. The first bump is connected to the oscillator circuit and disposed on a surface of the semiconductor chip facing the quartz crystal piece. The temperature sensor is bonded to the first bump.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

First Embodiment

Configuration of Crystal Oscillator 1 According to First Embodiment

Figure 1A:
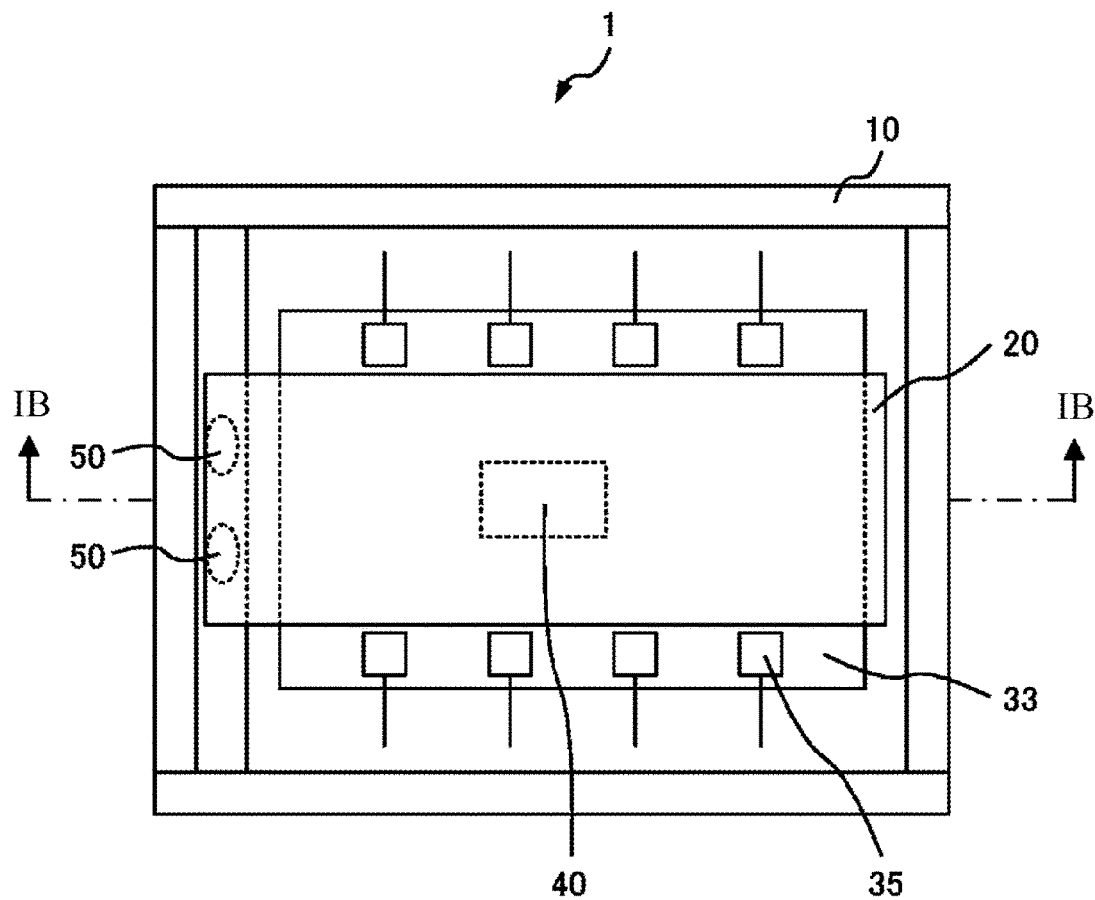
FIG. 1A and FIG. 1B are internal configuration diagrams of a crystal oscillator 1 according to a first embodiment.
Figure 1B:
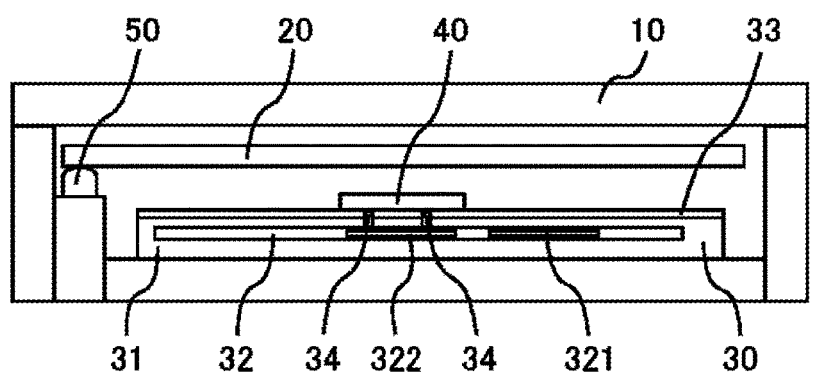

FIG. 1A and FIG. 1B are internal configuration diagrams of a crystal oscillator 1 according to a first embodiment. FIG. 1A is a layout of the crystal oscillator 1 according to the first embodiment. FIG. 1B is a cross-sectional view taken along a line IB-IB in FIG. 1A.

The crystal oscillator 1 according to the first embodiment is a temperature compensation type crystal oscillator (TCXO). The crystal oscillator 1 includes a quartz crystal piece 20, a semiconductor chip 30, and a temperature sensor device 40 inside a package 10. The quartz crystal piece 20 is secured to the package 10 with conductive connecting portions 50.

The semiconductor chip 30 is a semiconductor bare chip including a circuit that causes the quartz crystal piece 20 to oscillate at a frequency determined based on a temperature detected by the temperature sensor device 40. The temperature sensor device 40 is a device that detects an ambient temperature and outputs data indicating the detected temperature. The temperature sensor device 40 is, for example, a thermistor. The temperature sensor device 40 is secured to the semiconductor chip 30 in a top surface center. The temperature sensor device 40 is secured to a position facing the quartz crystal piece 20 to measure the temperature at proximity of the quartz crystal piece 20.

The following describes a structure of the semiconductor chip 30 and a connection configuration of the semiconductor chip 30 and the temperature sensor device 40 in detail. The semiconductor chip 30 includes a Si substrate 31, an internal circuit 32, a protecting layer 33, first connecting portions 34, and a plurality of wire bonding pads 35.

The Si substrate 31 is a base substrate that is formed of silicon (Si). The internal circuit 32 is formed by using the Si substrate 31 as a base substrate and includes an oscillator circuit 321 and a temperature detection circuit 322. The oscillator circuit 321 is a circuit to generate an oscillation signal that causes the quartz crystal piece 20 to oscillate. The temperature detection circuit 322 has a temperature compensation function in order to control the frequency of the oscillation signal output from the oscillator circuit 321 based on the temperature detected by the temperature sensor device 40.

The protecting layer 33 is formed on a surface of the Si substrate 31 and includes an IC insulating protective film (such as SiN) and a protective resin (such as polyimide). The first connecting portions 34 connect the internal circuit 32 to the temperature sensor device 40. The first connecting portions 34 are disposed in proximity of a center of the semiconductor chip 30. The detail of the first connecting portion 34 will be described later.

A plurality of the wire bonding pads 35 are terminals to secure wires that connect the internal circuit 32 to external terminals disposed in the package 10. As illustrated in FIG. 1A, the plurality of wire bonding pads 35 are disposed on both sides of the first connecting portions 34 on a surface of the semiconductor chip facing the quartz crystal piece 20.

Figure 2:
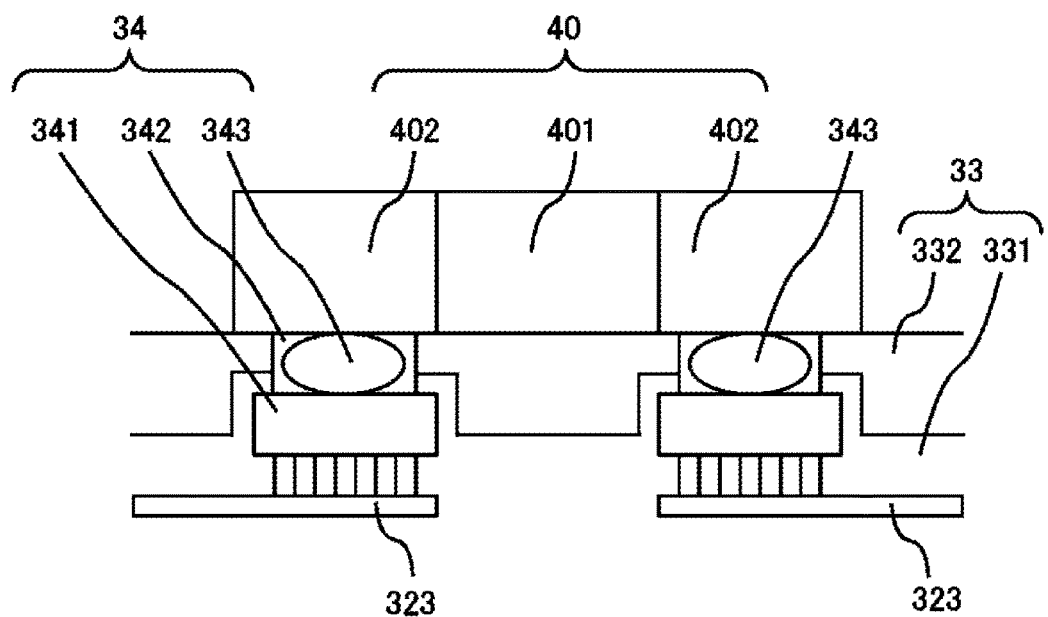
FIG. 2 is an enlarged figure of a peripheral portion of a temperature sensor device 40.

FIG. 2 is an enlarged figure in a peripheral portion of the temperature sensor device 40 in FIG. 1B. As illustrated in FIG. 2, the protecting layer 33 includes a $SiO_2$ insulating film 331 and a protective coat 332. The first connecting portion 34 includes a pad metal 341, a pad opening portion 342, and a first bump 343. The temperature sensor device 40 includes a temperature sensor 401 and temperature sensor connecting terminals 402.

The $SiO_2$ insulating film 331 is formed so as to cover metal wirings 323 and the pad metals 341. The protective coat 332 has a structure, for example, stacking SiN or polyimide over SiN and is formed so as to cover the $SiO_2$ insulating film 331.

The pad metal 341 is a metallic terminal that is formed between the metal wiring 323 and the first bump 343 in order to electrically connect the metal wiring 323 to the first bump 343. The pad opening portion 342 is an opening formed in the protecting layer 33. The first bump 343 is made of metal, such as Au, and is disposed on a surface of the quartz crystal piece 20 side of the semiconductor chip 30. The first bump 343 is disposed within the pad opening portion 342 and electrically connects the temperature sensor device 40 to the pad metal 341.

The temperature sensor 401 is an element that detects the ambient temperature and outputs the data indicating the detected temperature. The temperature sensor connecting terminal 402 is a metallic connecting terminal disposed in the temperature sensor 401. The temperature sensor 401 is connected to the temperature detection circuit 322 via the temperature sensor connecting terminals 402, the first bumps 343, the pad metals 341, and the metal wirings 323. Bonding the temperature sensor connecting terminal 402 to the first bump 343 ensures reducing a mounting area when the temperature sensor device 40 is bonded onto the semiconductor chip 30 compared with bonding the temperature sensor connecting terminal 402 to the wire bonding pads 35 by wire bonding. This can also shorten the wiring between the temperature sensor device 40 and the semiconductor chip 30, thus ensuring improving an electrical performance.

Thus, the temperature sensor device 40 being bonded to the semiconductor chip 30 via the first bump 343 ensures the quartz crystal piece 20 and the temperature sensor device 40 coming close to one another via a fill gas inside the package 10. As a result, the temperature of the quartz crystal piece 20 can be measured more accurately than the conventional one, thus ensuring a contribution to the improved frequency accuracy of the crystal oscillator 1.

Method for Manufacturing Crystal Oscillator 1 According to First Embodiment

The following describes a method for manufacturing the crystal oscillator 1. First, a semiconductor wafer is prepared. A plurality of the first bumps 343 are formed in the semiconductor wafer in which the internal circuit 32, the protecting layer 33, the pad metals 341, the pad opening portions 342, and the like are formed. Next, the semiconductor wafer is divided into a plurality of the semiconductor chips 30 each including the first bumps 343. Then, the temperature sensor device 40 is bonded to the first bumps 343. For example, after the temperature sensor device 40 is placed on the first bumps 343, applying a force to press the temperature sensor device 40 while applying an ultrasonic sound wave ensures bonding the temperature sensor device 40 to the first bumps 343. Alternatively, there is a method that divides the semiconductor wafer in which the first bumps 343 are formed into the semiconductor chips 30 after bonding the temperature sensor device 40 to the semiconductor wafer.

Then, the semiconductor chip 30 is bonded to the package 10 after the temperature sensor device 40 is bonded to the first bumps 343, the wire bonding pads 35 are wire bonded, and the quartz crystal piece 20 is secured at a position covering the temperature sensor device 40. Accordingly, with this manufacturing method, the temperature sensor device 40 and the semiconductor chip 30 are electrically connectable using a bump bonding process, thus ensuring manufacturing the crystal oscillator 1 according to the first embodiment using a semiconductor chip manufactured by a standard process flow.

Advantageous Effect by Crystal Oscillator 1 According to First Embodiment

As described above, the crystal oscillator 1 according to the first embodiment includes the temperature sensor device 40 bonded on a top surface of the semiconductor chip 30 using the first bumps 343. As a result, the quartz crystal piece 20 and the temperature sensor device 40 come close to ensure accurately measuring the temperature of the quartz crystal piece 20 compared with the conventional one, thus contributing the improved frequency accuracy. Bonding the temperature sensor device 40 to the semiconductor chip 30 using the bump ensures the downsized crystal oscillator 1.

Second Embodiment

Figure 3A:
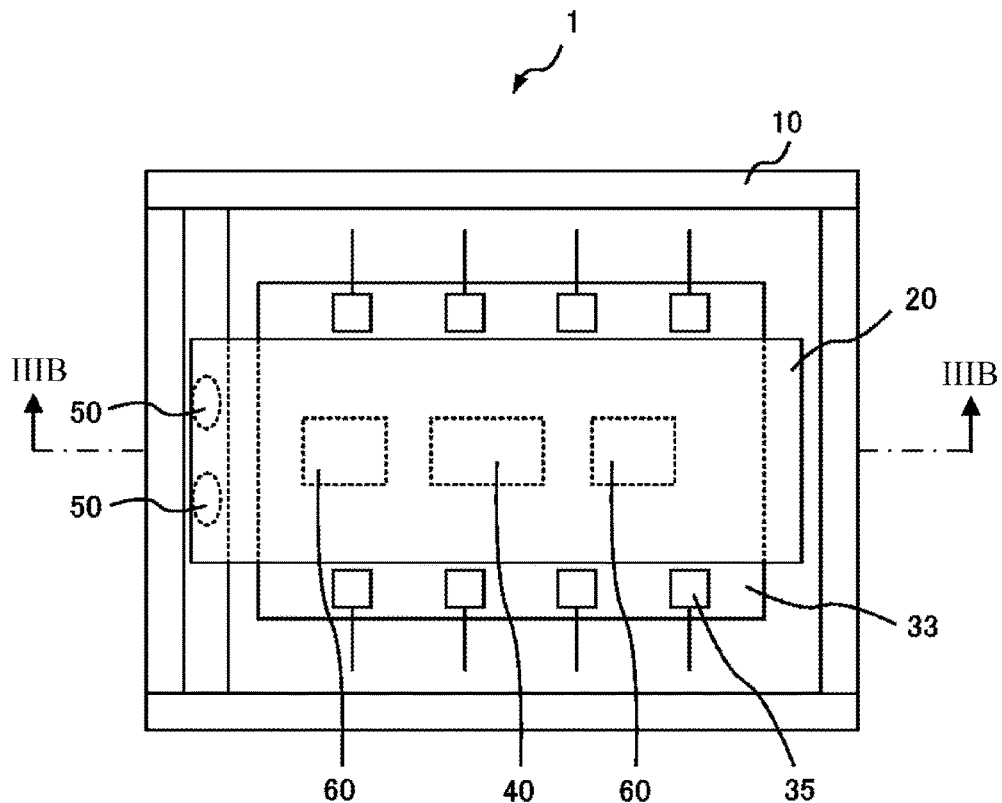
FIG. 3A and FIG. 3B are internal configuration diagrams of the crystal oscillator 1 according to a second embodiment.
Figure 3B:
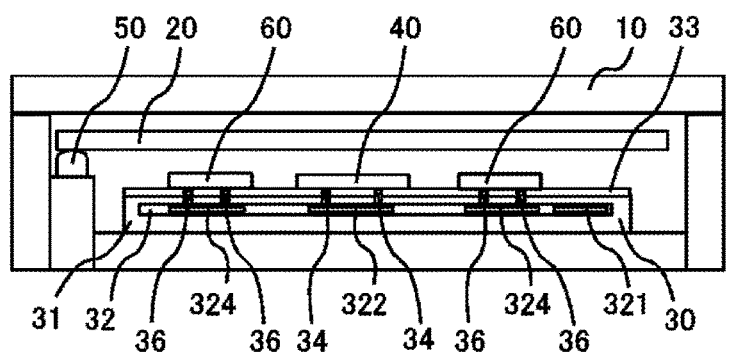

FIG. 3A and FIG. 3B are internal configuration diagrams of the crystal oscillator 1 according to a second embodiment. FIG. 3A is a layout of the crystal oscillator 1 according to the second embodiment. FIG. 3B is a cross-sectional view taken along a line IIIB-IIIB in FIG. 3A.

The crystal oscillator 1 according to the second embodiment is an oven controlled crystal oscillator (OCXO). The crystal oscillator 1 according to the second embodiment is different compared with the configuration of the crystal oscillator 1 according to the first embodiment that the crystal oscillator 1 includes heater circuits 324, second connecting portions 36, and heater devices 60.

The heater circuit 324 is included in the internal circuit 32 and is a circuit to control the temperature of the heater device 60. The second connecting portion 36 connects the internal circuit 32 to the heater device 60. In an example illustrated in FIG. 3A and FIG. 3B, two second connecting portions 36 are disposed at both sides of the first connecting portions 34. The detail of the second connecting portion 36 will be described later.

The heater device 60 is a device that controls the ambient temperature by emitting heat. The heater device 60 is, for example, a resistor. In the example illustrated in FIG. 3A and FIG. 3B, the crystal oscillator 1 includes two heater devices 60 each bonded to the second connecting portions 36. The two heater devices 60 are secured to the top surface of the semiconductor chip 30 at both sides of the temperature sensor device 40. The heater device 60 is secured at a position facing the quartz crystal piece 20 to control the temperature at the proximity of the quartz crystal piece 20.

Figure 4:
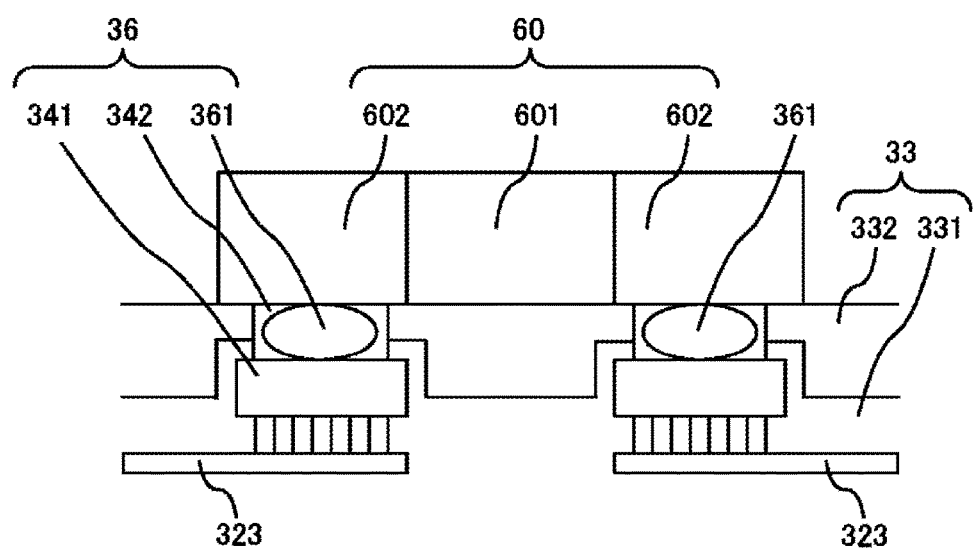
FIG. 4 is an enlarged figure of a peripheral portion of a heater device 60.

FIG. 4 is an enlarged figure of a peripheral portion of the heater device 60 in FIG. 3B. The second connecting portion 36 has a configuration similar to that of the first connecting portion 34, and includes the pad metal 341, the pad opening portion 342, and a second bump 361. The heater device 60 includes a heater 601 and heater connecting terminals 602.

The second bump 361 is similar to the first bump 343. The second bump 361 is made of metal, such as Au, and is disposed on the surface of the quartz crystal piece 20 side of the semiconductor chip 30. The second bump 361 is disposed within the pad opening portion 342. The heater 601 is an element that controls the ambient temperature by emitting heat. The heater connecting terminal 602 is a metallic connecting terminal disposed in the heater 601. The heater 601 is connected to the heater circuit 324 via the heater connecting terminals 602, the second bumps 361, the pad metals 341, and the metal wirings 323.

Method for Manufacturing Crystal Oscillator 1 According to Second Embodiment

The following describes a method for manufacturing the crystal oscillator 1 according to the second embodiment focusing on differences from the method for manufacturing the crystal oscillator 1 according to the first embodiment.

In a second bump formation process, the second bump 361 is formed on a surface where the first bump 343 is disposed after the first bump 343 is formed on the semiconductor wafer.

In a heater bonding process, the heater device 60 is bonded to the second bumps 361, for example, after the temperature sensor device 40 is bonded to the first bumps 343 disposed in the plurality of semiconductor chips 30. The heater bonding process is not limited to this, and the heater device 60 may be bonded to the second bumps 361 before the temperature sensor device 40 is bonded to the first bumps 343 disposed in the plurality of semiconductor chips 30 in the heater bonding process. In the heater bonding process, the heater device 60 is bonded to the second bumps 361, for example, by applying the force pressing the heater device 60 while applying the ultrasonic sound wave after the heater device 60 is placed on the second bumps 361.

In the heater bonding process, the heater device 60 may be bonded to the second bumps 361 before the semiconductor wafer is divided into the plurality of semiconductor chips 30.

Advantageous Effect by Crystal Oscillator 1 According to Second Embodiment

The crystal oscillator 1 having such configuration causes the temperature sensor device 40 to measure the temperature at the proximity of the quartz crystal piece 20 and the heater device 60 to control the temperature. This results in the improved thermal connection between the quartz crystal piece 20, the temperature sensor device 40, and the heater device 60 to ensure the improved frequency accuracy of the crystal oscillator 1.

Third Embodiment

Figure 5A:
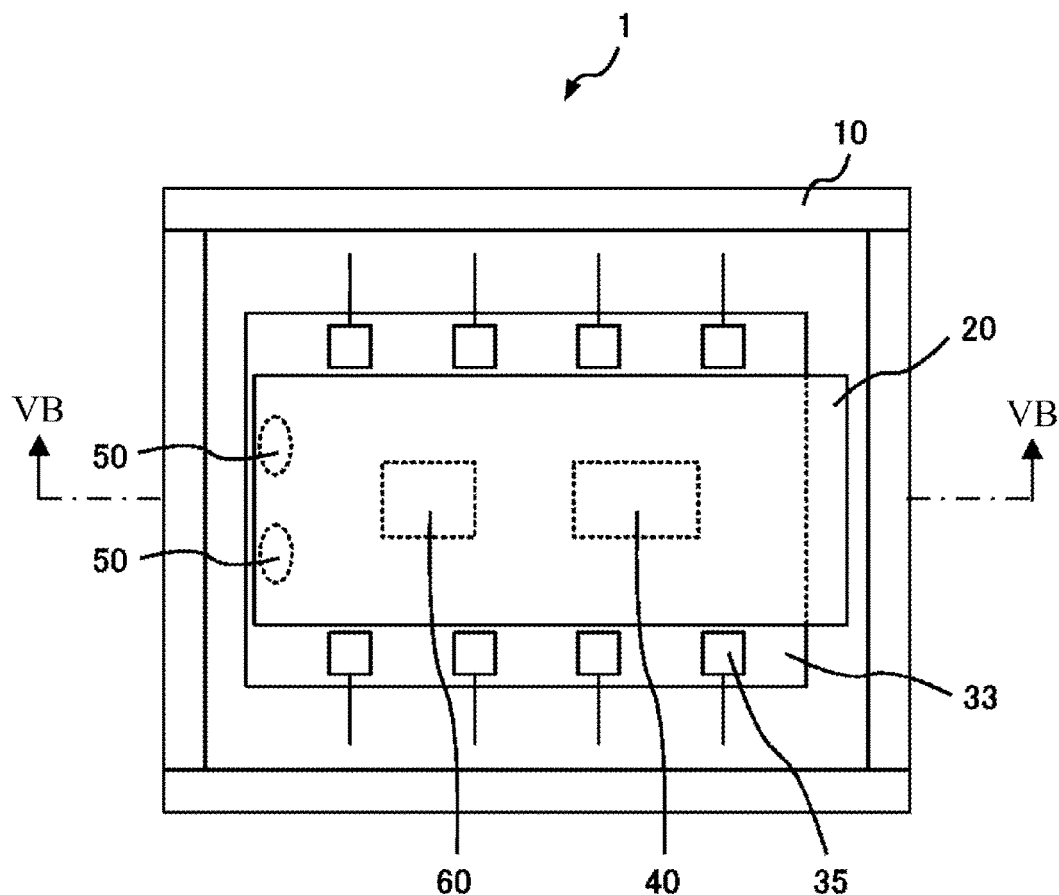
FIG. 5A and FIG. 5B are internal configuration diagrams of the crystal oscillator 1 according to a third embodiment.
Figure 5B:
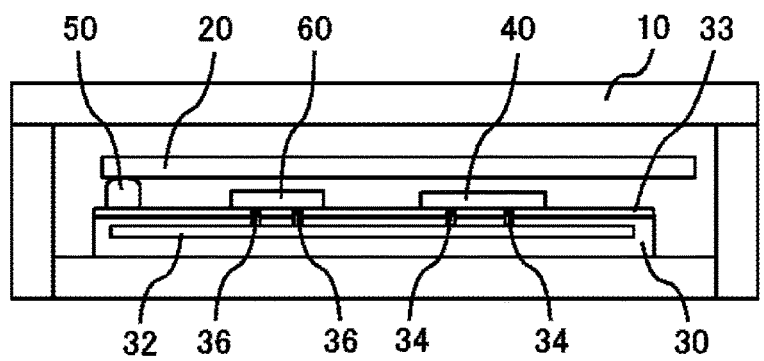

FIG. 5A and FIG. 5B are internal configuration diagrams of the crystal oscillator 1 according to a third embodiment. FIG. 5A is a layout of the crystal oscillator 1 according to the third embodiment. FIG. 5B is a cross-sectional view taken along a line VB-VB in FIG. 5A. The crystal oscillator 1 according to the third embodiment is the OCXO. The crystal oscillator 1 according to the third embodiment is different compared with the configuration of the crystal oscillator 1 according to the second embodiment that the quartz crystal piece 20 is directly secured onto the semiconductor chip 30 using the conductive connecting portions 50. The conductive connecting portion 50 is formed of a conductive resin. The conductive connecting portion 50 secures the quartz crystal piece 20 to the semiconductor chip 30 and electrically connects the quartz crystal piece 20 to the internal circuit 32.

Such configuration eliminates a need for a wiring to connect the conductive connecting portion 50 to a pad electrode on the semiconductor chip 30 in the package 10, thus ensuring the decreased size of the package 10. This results in downsizing the crystal oscillator 1.

Fourth Embodiment

Figure 6A:
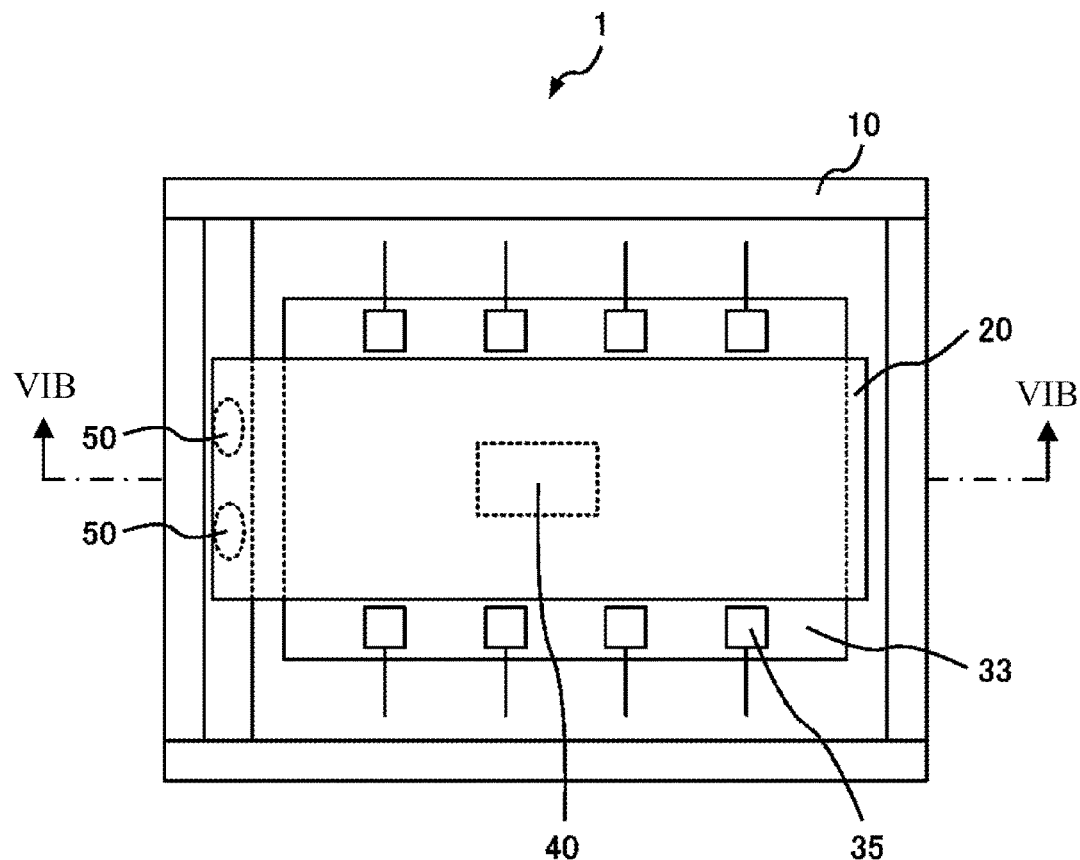
FIG. 6A and FIG. 6B are internal configuration diagrams of the crystal oscillator 1 according to a fourth embodiment.
Figure 6B:
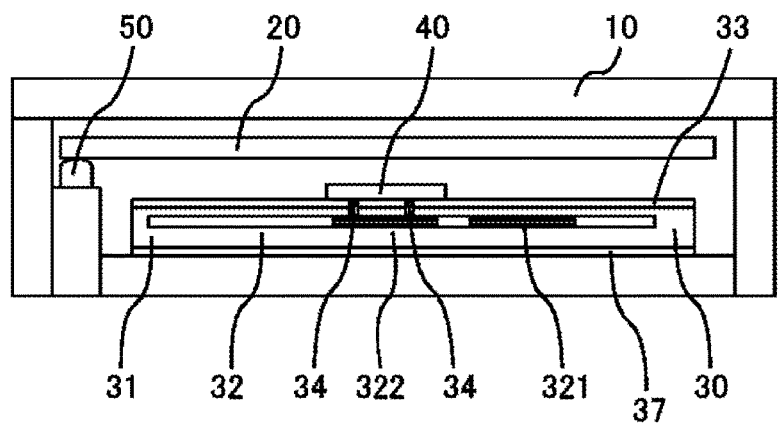

FIG. 6A and FIG. 6B are internal configuration diagrams of the crystal oscillator 1 according to a fourth embodiment. FIG. 6A is a layout of the crystal oscillator 1 according to the fourth embodiment. FIG. 6B is a cross-sectional view taken along a line VIB-VIB in FIG. 6A. The crystal oscillator 1 according to the fourth embodiment is the TCXO. The crystal oscillator 1 according to the fourth embodiment is different compared with the configuration of the crystal oscillator 1 according to the first embodiment that the crystal oscillator 1 according to the fourth embodiment includes a heat insulating film 37 as a heat insulating member.

The crystal oscillator 1 includes the heat insulating film 37 disposed on a surface on an opposite side of a surface where the first bump 343 is disposed in the semiconductor chip 30. The heat insulating film 37 is, for example, a $SiO_2$ film. The heat insulating film 37 may be a film using another heat insulating material.

Such configuration ensures the crystal oscillator 1 thermally separating the semiconductor chip 30 and the package 10. As a result, the crystal oscillator 1 can accurately measure the temperature of the quartz crystal piece 20 without being affected by an external heat from the package 10, thus ensuring the improved frequency accuracy.

Modification 1

The above description described an example in which the heat insulating film 37 is disposed in the crystal oscillator 1 that is the TCXO according to the first embodiment. However, the configuration is not limited to this, but the crystal oscillator 1 that is the OCXO according to the second embodiment and the third embodiment may include the heat insulating film 37 disposed on the surface on the opposite side of the surface where the first bump 343 is disposed in the semiconductor chip 30.

Modification 2

Figure 7A:
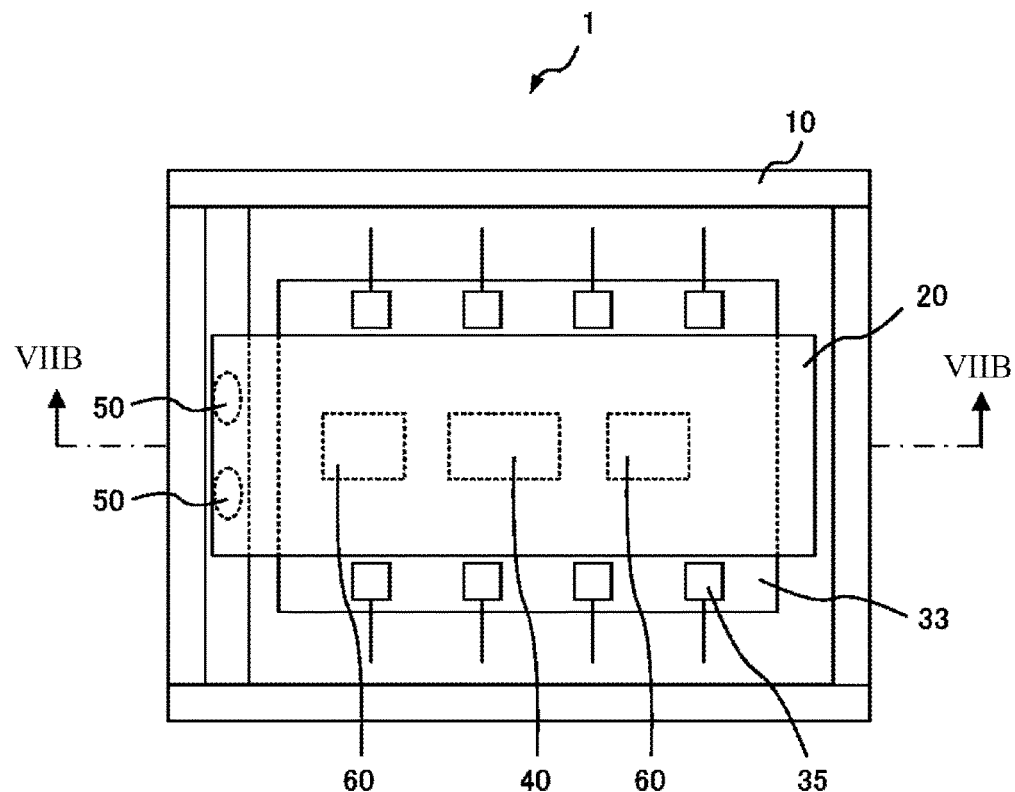
FIG. 7A and FIG. 7B are internal configuration diagrams (part 1) of the crystal oscillator 1 according to a modification of the fourth embodiment.
Figure 7B:
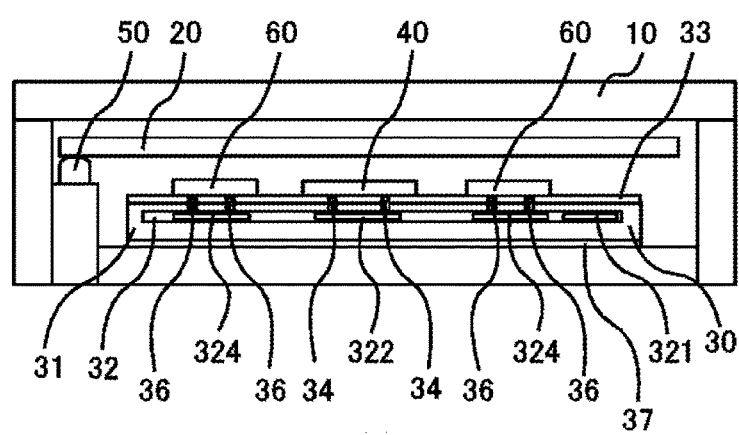
Figure 8A:
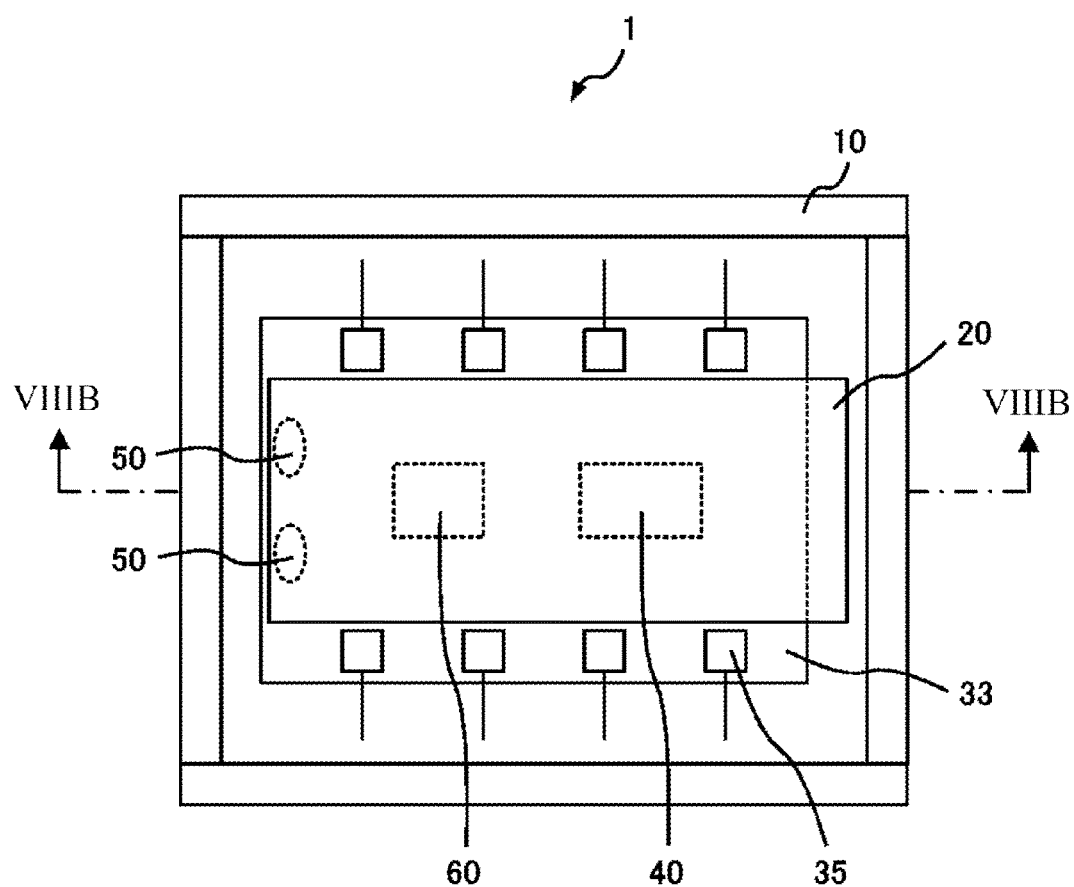
FIG. 8A and FIG. 8B are internal configuration diagrams (part 2) of the crystal oscillator 1 according to a modification of the fourth embodiment.
Figure 8B:
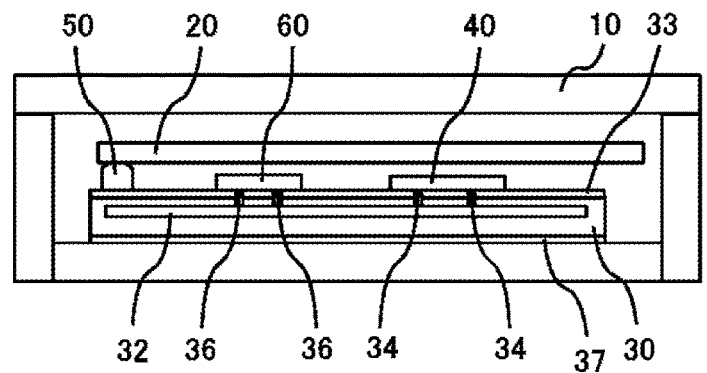
Figure 9:
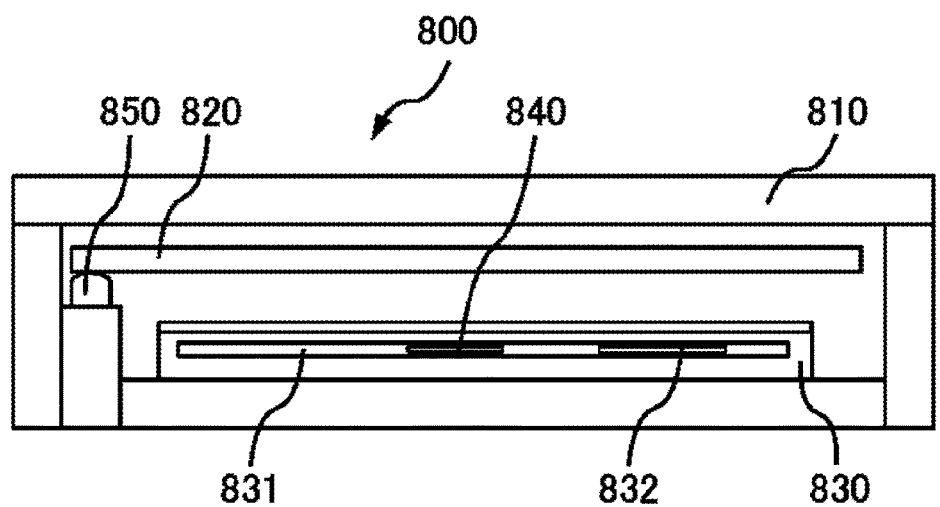
FIG. 9 is a cross-sectional view of a conventional crystal oscillator 800.

FIG. 7A, FIG. 7B, FIG. 8A and FIG. 8B are internal configuration diagrams of the crystal oscillator 1 according to modifications of the fourth embodiment. FIG. 7A is a layout of the crystal oscillator 1 when the crystal oscillator 1 according to the second embodiment includes the heat insulating film 37. FIG. 7B is a cross-sectional view taken along a line VIIB-VIIB in FIG. 7A. FIG. 8A is a layout of the crystal oscillator 1 when the crystal oscillator 1 according to the third embodiment includes the heat insulating film 37. FIG. 8B is a cross-sectional view taken along a line VIIIB-VIIIB in FIG. 8A. The crystal oscillator 1 in FIG. 7A, FIG. 7B, FIG. 8A and FIG. 8B is the OCXO. The crystal oscillator 1 in FIG. 7A, FIG. 7B, FIG. 8A and FIG. 8B includes the heat insulating film 37 disposed on the surface on the opposite side of the surface where the first bump 343 is disposed in the semiconductor chip 30.

Modification 3

While the above description described the example in which the heat insulating film 37 is formed in the semiconductor chip 30 of the crystal oscillator 1, the configuration is not limited to this, and the heat insulating film 37 may be formed on a bottom surface in the package 10 of the crystal oscillator 1. The heat insulating film 37 is formed on the bottom surface in the package 10, for example, before the semiconductor chip 30 is bonded to the package 10. The semiconductor chip 30 is bonded on the heat insulating film 37 formed on the bottom surface in the package 10. A plate having a heat insulating property may be adhered on the bottom surface in the package 10 of the crystal oscillator 1 as the heat insulating member.

Method for Manufacturing Crystal Oscillator 1 According to Fourth Embodiment The following describes the method for manufacturing the crystal oscillator 1 including the heat insulating film 37 focusing on differences from the manufacturing method for the crystal oscillator 1 according to the first embodiment and the second embodiment. In a heat insulating film formation process, the heat insulating film 37 is formed on the surface on the opposite side of the surface where the plurality of first bumps 343 are formed, for example, after the plurality of first bumps 343 are formed in the semiconductor wafer. In the heat insulating film formation process, the $SiO_2$ film is formed as the heat insulating film 37, for example, using a $SiO_2$ film forming device. In the heat insulating film formation process, the heat insulating film 37 may be formed on one surface of the semiconductor wafer before the plurality of first bumps 343 are formed in the semiconductor wafer. In this case, after the heat insulating film 37 of the semiconductor wafer is formed, the plurality of first bumps 343 are formed on the surface on the opposite side of the surface where the heat insulating film 37 is formed.

In the heat insulating film formation process, the heat insulating film 37 may be formed after the semiconductor wafer is divided into the plurality of semiconductor chips 30. In the heat insulating film formation process, the heat insulating film may be formed using not only $SiO_2$ but using another heat insulating material. Furthermore, in the heat insulating film formation process, the heat insulating film 37 may be formed by adhering the plate having the heat insulating property on the surface on the opposite side of the surface where the first bump 343 is disposed in the semiconductor chip 30.

Advantageous Effect of Crystal Oscillator 1 According to Fourth Embodiment

Such configuration ensures the crystal oscillator 1 according to the fourth embodiment reducing the influence of the temperature outside the package 10 to the quartz crystal piece 20 by thermally separating from the external environment, thus ensuring the improved frequency accuracy of the crystal oscillator 1. The crystal oscillator 1 ensures inhibiting the heat emitted by the heater 601 from being discharged outside the package 10, thus ensuring the efficient heating.

While the present disclosure has been described above with reference to the embodiments, the technical scope of the disclosure is not limited to the scope of the embodiments described above. It is apparent that a variety of variations and modifications of the above-described embodiments can be made by those skilled in the art. It is apparent from accompanying claims that such variations and modifications may also be encompassed by the technical scope of the disclosure.

The semiconductor chip may include a plurality of wire bonding pads, and the plurality of wire bonding pads is disposed on the same surface of the semiconductor chip of the surface of the semiconductor chip, and the plurality of wire bonding pads is disposed at both sides of the first bump, and the plurality of wire bonding pads is disposed on the surface of the semiconductor chip facing the quartz crystal piece.

The semiconductor chip may further include a second bump disposed on the surface of the semiconductor chip facing the quartz crystal piece. The crystal oscillator may further include a heater bonded to the second bump.

The semiconductor chip may further include a conductive connecting portion for securing the quartz crystal piece at a position covering the temperature sensor.

The crystal oscillator may further include a heat insulating member disposed on a surface on an opposite side of a surface where the first bump is disposed in the semiconductor chip.

According to a second aspect of this disclosure, there is provided a manufacturing method for a crystal oscillator. The manufacturing method includes preparing a semiconductor wafer, forming a plurality of first bumps in the semiconductor wafer, dividing the semiconductor wafer into a plurality of semiconductor chips each including the first bumps, bonding a temperature sensor to the first bumps, and securing a quartz crystal piece at a position covering the temperature sensor after bonding the temperature sensor.

The manufacturing method for the crystal oscillator may further include forming a second bump on a surface where the plurality of first bumps are formed in the semiconductor wafer and bonding a heater to the second bump.

The manufacturing method for the crystal oscillator may further include forming a heat insulating member on a surface on an opposite side of a surface where the plurality of first bumps are formed in the semiconductor wafer.

The manufacturing method for the crystal oscillator may further include forming a heat insulating member on one surface of the semiconductor water. The plurality of first bumps may be formed on a surface on an opposite side of a surface where the heat insulating member is formed in the forming the plurality of first bumps.

With the present disclosure, a thermal connection between a quartz crystal piece, a temperature sensor, and a heater device is improved to improve frequency accuracy of a crystal oscillator.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A crystal oscillator comprising:
   a quartz crystal piece;
   a semiconductor chip that includes an oscillator circuit to cause the quartz crystal piece to oscillate and a first bump, the first bump being connected to the oscillator circuit and disposed on a surface of the semiconductor chip facing the quartz crystal piece; and
   a temperature sensor bonded to the first bump,
   wherein the semiconductor chip further includes a second bump disposed on the surface of the semiconductor chip facing the quartz crystal piece, and
   the crystal oscillator further includes a heater bonded to the second bump.

2. The crystal oscillator according to claim 1, wherein
   the semiconductor chip includes a plurality of wire bonding pads,
   wherein the plurality of wire bonding pads is disposed on the same surface of the semiconductor chip of the surface of the semiconductor chip, and
   the plurality of wire bonding pads is disposed at both sides of the first bump, and
   the plurality of wire bonding pads is disposed on the surface of the semiconductor chip facing the quartz crystal piece.

3. The crystal oscillator according to claim 1, wherein
   the semiconductor chip further includes a conductive connecting portion for securing the quartz crystal piece at a position covering the temperature sensor.

4. The crystal oscillator according to claim 1, further comprising
   a heat insulating member disposed on a surface on an opposite side of the surface where the first bump is disposed in the semiconductor chip.

5. A manufacturing method for a crystal oscillator, the manufacturing method comprising:
   preparing a semiconductor wafer;
   forming a plurality of first bumps in the semiconductor wafer;
   dividing the semiconductor wafer into a plurality of semiconductor chips each including the first bumps;
   bonding a temperature sensor to the first bumps;
   securing a quartz crystal piece at a position covering the temperature sensor after bonding the temperature sensor;
   forming a second bump on a surface where the plurality of first bumps are formed in the semiconductor wafer; and
   bonding a heater to the second bump.

6. The manufacturing method for the crystal oscillator according to claim 5, further comprising
   forming a heat insulating member on a surface on an opposite side of the surface where the plurality of first bumps are formed in the semiconductor wafer.

7. The manufacturing method for the crystal oscillator according to claim 5, further comprising
   forming a heat insulating member on one surface of the semiconductor wafer, wherein
   the plurality of first bumps are formed on the surface on an opposite side of a surface where the heat insulating member is formed in the forming the plurality of first bumps.

* * * * *